United States Patent
Adetutu et al.

(10) Patent No.: US 7,144,825 B2
(45) Date of Patent: Dec. 5, 2006

(54) MULTI-LAYER DIELECTRIC CONTAINING DIFFUSION BARRIER MATERIAL

(75) Inventors: Olubunmi O. Adetutu, Austin, TX (US); Tien Ying Luo, Austin, TX (US); Hsing H. Tseng, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/687,271

(22) Filed: Oct. 16, 2003

(65) Prior Publication Data

US 2005/0085092 A1    Apr. 21, 2005

(51) Int. Cl.
*H01L 21/00* (2006.01)

(52) U.S. Cl. .................. 438/763; 438/528; 438/287

(58) Field of Classification Search ............ 438/763, 438/528, 287
See application file for complete search history.

(56) References Cited

U.S. PATENT DOCUMENTS

| | | | |
|---|---|---|---|
| 5,308,601 A | 5/1994 | Hampden-Smith et al. | |
| 5,698,464 A * | 12/1997 | Tsunoda | 438/4 |
| 5,972,804 A | 10/1999 | Tobin et al. | |
| 6,228,779 B1 * | 5/2001 | Bloom et al. | 438/763 |
| 6,350,643 B1 | 2/2002 | Hintermaier et al. | |
| 6,465,828 B1 * | 10/2002 | Agarwal | 257/296 |
| 6,486,080 B1 | 11/2002 | Chooi et al. | |
| 6,500,735 B1 | 12/2002 | Usuda | |
| 6,538,274 B1 * | 3/2003 | Zheng et al. | 257/296 |
| 6,544,900 B1 | 4/2003 | Raaijmakers et al. | |
| 6,723,663 B1 * | 4/2004 | Wieczorek et al. | 438/776 |
| 6,780,706 B1 * | 8/2004 | Agarwal | 438/240 |
| 6,787,451 B1 * | 9/2004 | Shimamoto et al. | 438/630 |
| 6,888,186 B1 * | 5/2005 | Zheng et al. | 257/296 |
| 6,933,248 B1 * | 8/2005 | Grider | 438/786 |
| 6,989,319 B1 * | 1/2006 | Ramsbey et al. | 438/520 |
| 2004/0023513 A1 * | 2/2004 | Aoyama et al. | 438/778 |
| 2005/0048746 A1 * | 3/2005 | Wang | 438/528 |
| 2005/0062114 A1 * | 3/2005 | Wang | 257/410 |
| 2005/0085092 A1 * | 4/2005 | Adetutu et al. | 438/763 |

FOREIGN PATENT DOCUMENTS

JP    63-23635    10/1988

OTHER PUBLICATIONS

Byeong-Ok Cho et al., "Tuning the Electrical Properties of Zirconium Oxide Thin Films," *Applied Physics Letters*, Feb. 11, 2002, vol. 80, No. 6, pp. 1052-1054.
A. L. P. Rotondaro, et al., "Advanced CMOS Transistors with a Novel HfSiON Gate Dielectric," *2002 Symposium on VLSI Technology Digest of Technical Papers*, Section 15.2.
Yuji Saito, et al., "Advantage of Radical Oxidation for Improving Reliability of Ultra-Thin Gate Oxide," *2002 Symposium on VLSI Technology Digest of Technical Papers*.

(Continued)

*Primary Examiner*—Laura M. Schillinger
(74) *Attorney, Agent, or Firm*—Michael J. Balconi-Lami; David G. Dolezal

(57) ABSTRACT

A method for forming a dielectric is disclosed. The method comprises forming a first dielectric layer over semiconductor material. A diffusion barrier material is introduced into the first dielectric layer. Lastly, a second dielectric layer is formed over the first dielectric layer after the introducing.

18 Claims, 2 Drawing Sheets

OTHER PUBLICATIONS

M. Togo, et al., "Low-Leakage and Highly-Reliable 1.5 nm SiON Gate-Dielectric Using Radical Oxynitridation for Sub-0.1 μm CMOS," *2000 Symposium on VLSI Technology Digest of Technical Papers*.

Al-Shareef et al., "Device Performance of *in-situ* Steam Generated Gate Dielectric Nitrided by Remote Plasma Nitridation," *Applied Physics Lettes*, Jun. 11, 2001, vol. 78, No. 24, pp. 3875-3877/.

Nicollian et al., "Extending Reliability Scaling Limit of SiO2 Through Plasma Nitridation," *IEDM Tech. Dig.*, 2000, pp. 545-548.

Tseng et al., "Ultra-Thin Decoupled Plasma Nitridation (DPN) Oxynitride Gate Dielectric for 80-nm Advanced Technology," *IEEE Electron Device Letters*, Dec. 2002, vol. 23, No. 12, pp. 704-706.

* cited by examiner

MULTI-LAYER DIELECTRIC CONTAINING DIFFUSION BARRIER MATERIAL

BACKGROUND

The present disclosures relate to semiconductor devices and semiconductor device manufacturing, and more particularly, to a multi-layer dielectric containing diffusion barrier material.

RELATED ART

As the dimensions of semiconductor devices continue to get smaller and smaller, various semiconductor device design requirements must be met. For example, the design requirements for a silicon nitride gate dielectric may include one or more of reducing gate leakage, maintaining or improving device performance (Gm, mobility) with a targeted threshold voltage. In addition, the design requirements may require a reduced negative bias temperature instability (NBTI), where $V_T$ shift after high temp stressing is a big problem on silicon nitride (SiN) or silicon oxynitride (SiON).

One possible way to reduce gate leakage includes using silicon nitride (SiN) on a single crystal substrate. The dielectric constant (k) of pure SiN is on the order of approximately 7.8. Accordingly, the dielectric constant (k) of pure SiN is approximately two times (twice) that of $SiO_2$. However, one problem with using pure deposited SiN is that it produces a high interface state density (Dit) and bulk traps.

Accordingly, there is needed a structure and method for overcoming the problems in the art as outlined above.

SUMMARY

According to one embodiment, a method for forming a dielectric comprises forming a first dielectric layer over semiconductor material; introducing a diffusion barrier material into the first dielectric layer; and forming a second dielectric layer over the first dielectric layer after the introducing.

BRIEF DESCRIPTION OF THE DRAWINGS

The embodiments of the present disclosure are illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve an understanding of the embodiments of the present disclosure.

DETAILED DESCRIPTION

As will be discussed further herein, the present embodiments provide a low nitrogen concentration at a lower interface between the first dielectric layer and the substrate, to minimize interface state density (Dit) and minimize fixed charges (or bulk traps). One such interface includes a SiON/Si interface. The present embodiments further provide a low nitrogen concentration at the lower interface, between the first dielectric layer and the substrate, to reduce negative bias temperature instability.

In addition, the embodiments of the present disclosure provide high nitrogen concentration in at least an interface between the first dielectric layer and the second dielectric layer to block undesired dopant penetration. For example, the interface may include an interface between a high K (or medium K) dielectric and an underlying SiON, wherein the high nitrogen concentration acts as a barrier layer to block undesired dopant penetration from an overlying P+ poly gate or metal gate.

Figure 1:
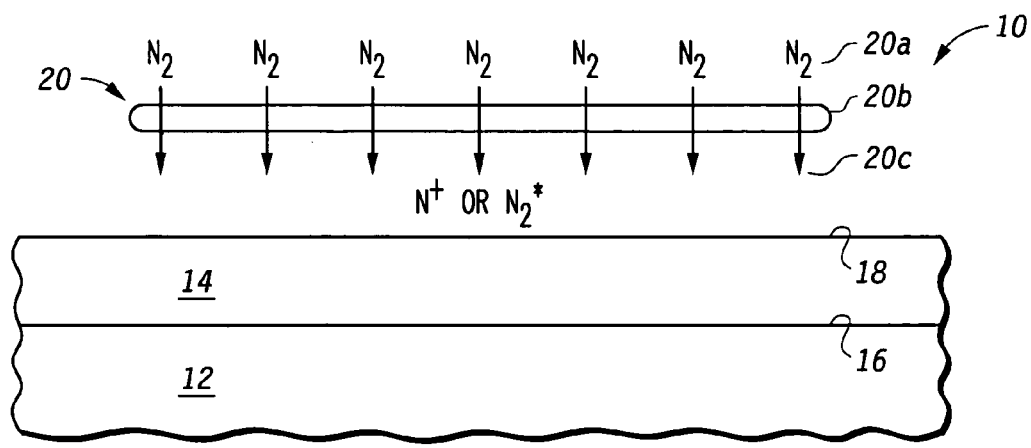
FIG. 1 is a cross-sectional view of a portion of a multi-layer dielectric structure during fabrication according to one embodiment of the present disclosure.

FIG. 1 is a cross-sectional view of a portion of a multi-layer dielectric structure during fabrication according to one embodiment of the present disclosure. A wafer structure 10 includes a substrate 12 having a dielectric layer 14 disposed thereon, forming an interface 16 between the substrate and the dielectric layer. Substrate 12 may include any one of a bulk silicon substrate, an SOI substrate, or other single crystal substrate. In one embodiment, the dielectric layer 14 includes a silicon dioxide ($SiO_2$) layer. Silicon dioxide layer 14 is formed on substrate 12, using any well known technique, to have a thickness on the order of approximately 10 to 15 angstroms or less. Furthermore, layer 14 has a top surface 18.

Subsequent to forming layer 14, the wafer structure 10 is processed in a manner to transform layer 14 into a nitrided oxide layer. In one embodiment, layer 14 is transformed into a plasma nitrided oxide layer (PNO layer). Forming the PNO includes exposing layer 14 to a plasma nitridation process 20. The plasma nitridation process 20 includes using a pure nitrogen gas 20a fed into plasma 20b for creation of ionic and radical species of $N^+$ and $N_2^*$ (denoted by reference numeral 20c) impinging upon surface 18 of layer 14. Furthermore, the plasma nitrided thin base oxide layer incorporates a small amount of N at the bottom interface and a relatively high N at the top interface. Plasma sources are known in the art and not further discussed herein. In another embodiment, layer 14 can be transformed into the nitrided oxide layer using nitrogen implantation, a thermal anneal using a nitrogen species, or other suitable method.

Figure 2:
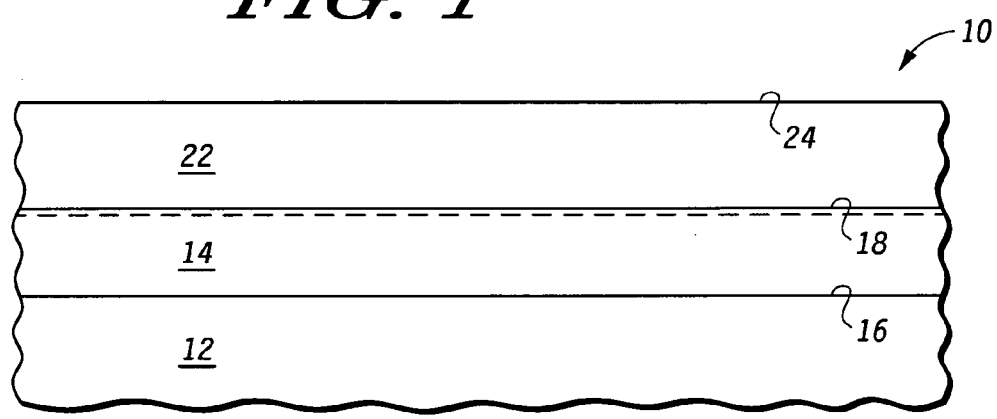
FIG. 2 is a cross-sectional view of the portion of the multi-layer dielectric structure of FIG. 1 during further fabrication according to one embodiment of the present disclosure.

FIG. 2 is a cross-sectional view of the portion of the multi-layer dielectric structure of FIG. 1 during further fabrication according to one embodiment of the present disclosure. That is, a second dielectric layer 22 is formed on surface 18 of layer 14, the second dielectric layer 22 having a thickness on the order of approximately 10–30 angstroms or more, depending upon the material of the layer. Second dielectric layer 22 includes a high k or medium k dielectric material, to include at least one of metal oxide, metal silicate, or metal oxynitride. A top surface of dielectric layer 22 is denoted by reference numeral 24. The dielectric material can include one or more other materials as provided herein below.

In one embodiment, dielectric layer 22 includes silicon nitride ($Si_3N_4$) for providing a high level of nitrogen at the top of dielectric layer 14. Depositing silicon nitride on top of the PNO layer 14 takes advantage of the gradual gradient N profile of the PNO layer. Lastly, one or more of the following may be used for the $Si_3N_4$ deposition including: atomic layer deposition (ALD) SiN deposition, rapid thermal chemical vapor deposition (RTCVD), low pressure chemical vapor deposition (LPCVD) SiN, or plasma enhanced CVD (PECVD) SiN to achieve a final nitrogen profile close to an ideal profile.

Formation of the second dielectric layer 22 upon layer 14 also includes the forming of a diffusion barrier, wherein the diffusion barrier is formed at least at the surface 18 of layer 14. In one embodiment, the diffusion barrier includes a thin layer of nitrogen having a thickness on the order of less than 10 angstroms. The diffusion barrier prevents penetration of undesired dopants from subsequently formed layers, such as, a subsequently formed gate electrode. In another embodiment, the second dielectric layer forms a diffusion. barrier that includes the entire second dielectric layer, for example, a pure nitride layer.

Figure 3:
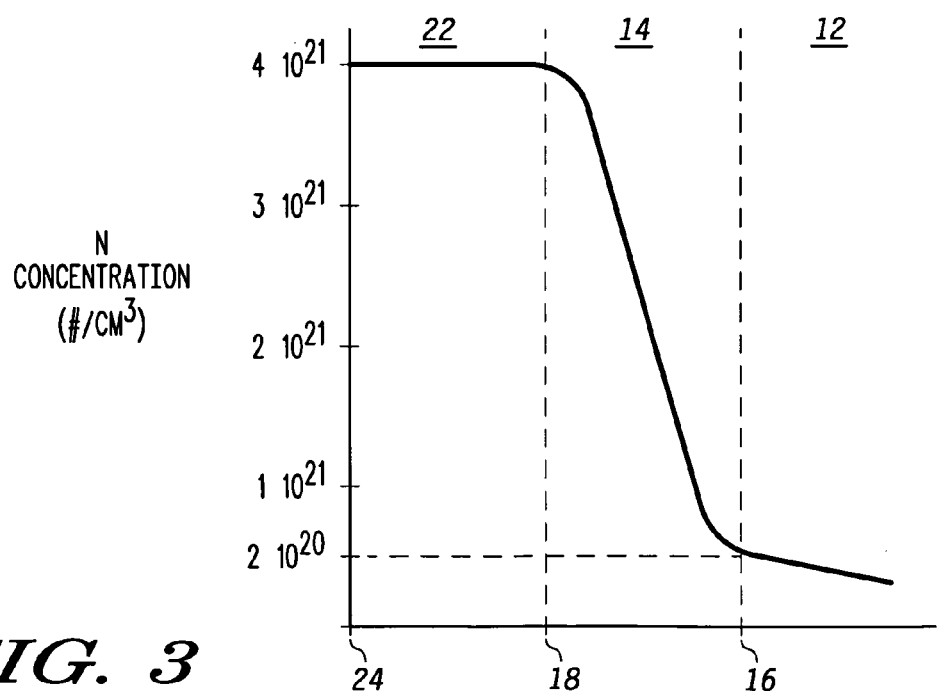
FIG. 3 is a graphical representation of a nitrogen concentration profile within the portion of the multi-layer dielectric structure of FIG. 2.

FIG. 3 is a graphical representation of a nitrogen concentration profile within the portion of the multi-layer dielectric structure of FIG. 2. In particular, the graphical representation profile is shown in terms of nitrogen concentration across the depths of layers 22, 14, and 12. The vertical axis includes nitrogen concentration in units of number of nitrogen atoms per cubic centimeter (#/cm$^3$). The horizontal axis includes a depth dimension representation of layers 22, 14, and 12, as well as respective surfaces/interfaces 24, 18, and 16.

In one example, as shown, dielectric layer 22 contains a nitrogen concentration profile on the order of approximately $4\times10^{21}$ per cm$^3$ throughout the depth dimension of layer 22, that is, across the depth of layer 22 from surface 24 to surface 18 of layer 14. Layer 14 includes a nitrogen concentration profile in the form of a gradual gradient, beginning with a nitrogen concentration on the order of approximately $4\times10^{21}$ per cm$^3$ at surface/interface 18 and gradually decreasing to a level on the order of approximately $2\times10^{20}$ per cm$^3$ at surface/interface 16 of substrate 12. The nitrogen concentration proximate surface/interface 16 preferably includes a minimal nitrogen incorporation. In addition, from the surface/interface 16, the nitrogen concentration further diminishes with depth within substrate 12.

In addition, other nitrogen concentration profiles for layer 22 are possible. For example, layer 22 may not contain any nitrogen at all. Moreover, layer 22 may contain a different profile and/or level of nitrogen than as shown in FIG. 3.

Figure 4:
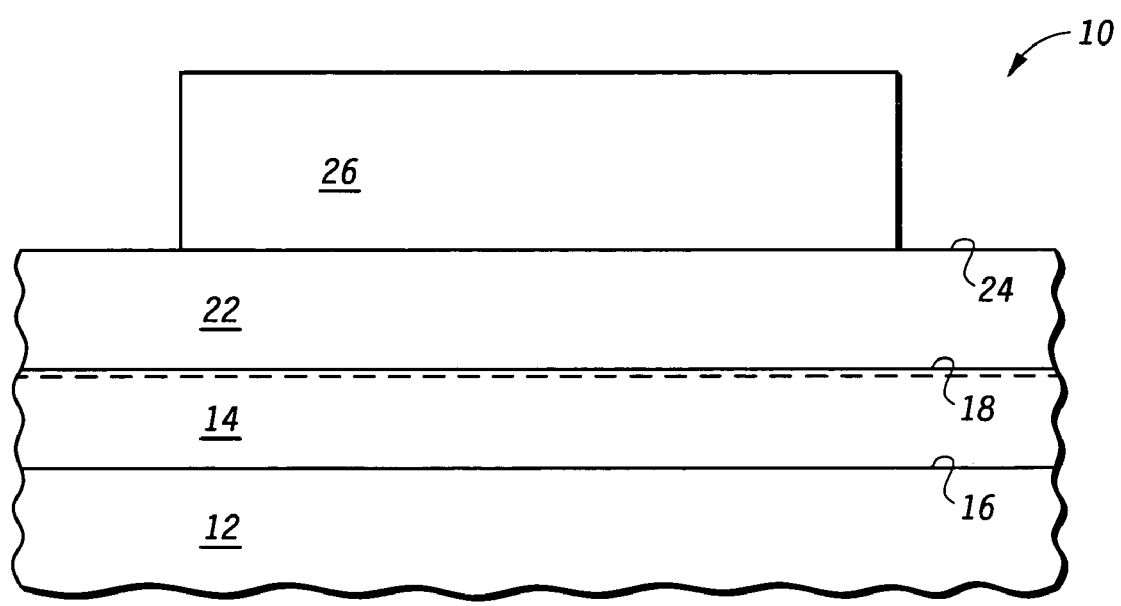
FIG. 4 is a cross-sectional view of the multi-layer dielectric structure according to an embodiment of the present disclosure.

FIG. 4 is a cross-sectional view of the multi-layer dielectric structure according to an embodiment of the present disclosure. In particular, a gate electrode 26 is formed on surface 24 of dielectric layer 22. Gate electrode 26 includes either one of a poly material or a metal, having a thickness sufficient for an intended semiconductor device. Forming the gate electrode 26 includes forming a layer of gate material over the second dielectric layer and patterning the layer of gate material to form a gate from the layer of gate material, the gate being located over the second dielectric layer.

The stack structure of the present embodiments include a gradient N concentration profile within the first dielectric layer 14, with a low concentration of N at the bottom interface between the first dielectric layer and the underlying substrate. The stack structure further includes a total high overall N concentration that provides an overall higher dielectric constant (k) and lower leakage current (Jg).

Accordingly, the present embodiments advantageously provide for overall higher k, better carrier mobility, smaller VT shift and small NBTI due to lower N amount at the $SiO_2$/Si interface. The embodiments also reduce and/or prevent undesired boron (B) penetration due to most of nitrogen being distributed at the top of the SiON, resulting in better dielectric reliability (TDDB) and reduced Vt shift. The embodiments still further provide lower Dit, and further provide for higher performance and hot carrier immunity (HCI). The higher performance and HCI are provided due to low N concentration at the bottom interface, between the first dielectric layer 14 and the underlying substrate 12. Still further, the embodiments provide benefits of $T_{ox}$ scalability and gate leakage reduction due to high nitrogen at the bulk of the gate dielectric.

According to one embodiment, the multi-layer dielectric structure includes a two-step nitridation process. The two-step nitridation process utilizes different controllable nitridation conditions of each step to achieve a high [N] at the top interface and the bulk, as well as low [N] at the bottom interface.

According to one embodiment of the present disclosure, a method for forming a dielectric includes forming a first dielectric layer over semiconductor material, introducing a diffusion barrier material into the first dielectric layer, and forming a second dielectric layer over the first dielectric layer after the introducing.

In one embodiment, the diffusion layer material includes nitrogen and the second dielectric layer is a relatively higher K dielectric than the first dielectric layer. The process of introducing a diffusion barrier material into the first dielectric layer includes at least one of the following: performing plasma processing of the diffusion barrier material into the first dielectric layer; implanting the diffusion barrier material into the first dielectric layer; and performing a thermal anneal of material including the diffusion barrier material into the first dielectric layer.

In one embodiment, the semiconductor material includes silicon. The semiconductor material includes at least one of single crystal silicon, strained silicon, or silicon germanium. In another embodiment, the first dielectric layer includes silicon dioxide. Alternatively, the first dielectric layer can include at least one of germanium oxide and silicon germanium oxide. In yet another embodiment, the second dielectric layer includes silicon nitride. Alternatively, the second dielectric layer includes at least one of germanium nitride, silicon germanium nitride, and a metal silicon oxynitride.

Still further, the second dielectric layer can include a high K dielectric, wherein the high K dielectric includes at least one of a metal oxide, a metal silicate, and a metal oxynitride. The metal oxide includes at least one of hafnium oxide, aluminum oxide, lanthanum oxide, titanium oxide, and tantalum oxide. The metal silicate includes at least on of hafnium silicate, aluminum silicate, lanthanum silicate, titanium silicate, and tantalum silicate. The metal oxynitride includes at least one of hafnium oxynitride, aluminum oxynitride, lanthanum oxynitride, titanium oxynitride, and tantalum oxynitride. Lastly, the metal silicon oxynitride includes at least one of hafnium silicon oxynitride, aluminum silicon oxynitride, lanthanum silicon oxynitride, titanium silicon oxynitride, and tantalum silicon oxynitride.

After the introducing, the diffusion material has a gradual gradient profile in the first dielectric layer. In other words, after the introducing, a bottom portion of the first dielectric layer has lower concentration of the diffusion barrier material than an upper portion of the first dielectric layer, wherein a concentration gradient profile is formed that gradually transitions from the higher concentration at the upper portion to the lower concentration at the bottom portion. Still further, the introducing forms a barrier layer including the diffusion barrier material in an upper portion of the first dielectric layer.

According to another embodiment, a method includes forming a first dielectric layer of silicon dioxide over semiconductor material of silicon. Nitrogen is introduced into the first dielectric layer. A second dielectric layer is formed over the first dielectric layer after the introducing, wherein the second layer includes silicon nitride. Lastly, a layer of gate material is formed over the second dielectric layer.

In one embodiment, the introducing includes performing a plasma nitridation process. The plasma nitridation process is characterized as a remote plasma nitridation process. In another embodiment, the introducing includes implanting nitrogen into the first dielectric layer. The introducing further includes annealing the first dielectric layer after the implanting. Still further, in another embodiment, the introducing includes flowing a nitrogen bearing gas over the first dielectric layer and then annealing the first dielectric layer.

After the introducing, the nitrogen has a gradual gradient profile in the first dielectric layer. In other words, after the introducing, a bottom portion of the first dielectric layer has lower concentration of nitrogen than an upper portion of the first dielectric layer. Furthermore, the introducing forms a barrier layer of silicon nitride in an upper portion of the first dielectric layer. The method further includes patterning the layer of gate material to form a gate from the layer of gate material, the gate being located over the second dielectric layer.

According to yet another embodiment of the present disclosure, a semiconductor device includes semiconductor material; a first dielectric layer located over the semiconductor material, wherein the first dielectric layer includes a diffusion barrier material having a gradual gradient profile and having a higher concentration is an upper portion of the first dielectric layer and a low concentration in a lower portion of the first dielectric layer; a second deictic layer located over the first dielectric layer; and a gate located over the second dielectric layer.

The diffusion layer material of the device includes nitrogen. The second dielectric layer is a relatively higher K dielectric than the first dielectric layer. The semiconductor material includes silicon. Alternatively, the semiconductor material can include at least one of single crystal silicon, strained silicon, or silicon germanium. In addition, the first dielectric layer can include silicon dioxide. Alternatively, the first dielectric layer can include at least one of germanium oxide and silicon germanium oxide. The second dielectric layer includes silicon nitride. Alternatively, the second dielectric layer can include at least one of one of germanium nitride and silicon germanium nitride.

In another embodiment, the second dielectric layer includes a high K dielectric. The high K dielectric includes at least one of a metal oxide, a metal silicate, and a metal oxynitride. The metal oxide includes at least one of hafnium oxide, aluminum oxide, lanthanum oxide, titanium oxide, and tantalum oxide. The metal silicate includes at least one of hafnium silicate, aluminum silicate, lanthanum silicate, titanium silicate, and tantalum silicate. The metal oxynitride includes at least one of hafnium oxynitride, aluminum oxynitride, lanthanum oxynitride, titanium oxynitride, and tantalum oxynitride. The metal silicon oxynitride includes at least one of hafnium silicon oxynitride, aluminum silicon oxynitride, lanthanum silicon oxynitride, titanium silicon oxynitride, and tantalum silicon oxynitride. Furthermore, the device includes a barrier layer located in an upper portion of the first dielectric layer, the barrier layer including the diffusion barrier material.

In the foregoing specification, the disclosure has been described with reference to various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements by may include other elements not expressly listed or inherent to such process, method, article, or apparatus.

What is claimed is:

1. A method for forming a dielectric comprising:
   forming a first dielectric layer over semiconductor material;
   introducing a diffusion barrier material into the first dielectric layer after the first dielectric layer alone is formed, wherein introducing the diffusion barrier material includes creating a gradual gradient diffusion barrier concentration profile within the first dielectric layer in which a concentration of the diffusion barrier material proximate a first surface of the first dielectric layer is an order of magnitude higher than a concentration of the diffusion barrier material proximate a second surface opposite the first surface, the second surface being located at an interface between the first dielectric layer and the semiconductor material; and
   forming a second dielectric layer over the first dielectric layer after the introducing.

2. The method of claim 1 wherein the diffusion layer material includes nitrogen.

3. The method of claim 1 wherein the second dielectric layer is a relatively higher K dielectric than the first dielectric layer.

4. The method of claim 1 wherein the introducing further includes:
   performing plasma processing of the diffusion barrier material into the first dielectric layer.

5. The method of claim 1 wherein the introducing further includes:
   implanting the diffusion barrier material into the first dielectric layer.

6. The method of claim 1 wherein the introducing further includes:
   performing a thermal anneal of material including the diffusion barrier material into the first dielectric layer.

7. The method of claim 1 wherein the semiconductor material includes silicon.

8. The method of claim 7 wherein the semiconductor material includes at least one of single crystal silicon, strained silicon, or silicon germanium.

9. The method of claim 1 wherein the first dielectric layer includes silicon oxide.

10. A method for forming a dielectric comprising:
forming a first dielectric layer over semiconductor material;
introducing a diffusion barrier material into the first dielectric layer; and
forming a second dielectric layer over the first dielectric layer after the introducing, wherein the first dielectric layer includes at least one of germanium oxide and silicon germanium oxide.

11. The method of claim 1 wherein the second dielectric layer includes silicon nitride.

12. A method for forming a dielectric comprising:
forming a first dielectric layer over semiconductor material;
introducing a diffusion barrier material into the first dielectric layer; and
forming a second dielectric layer over the first dielectric layer after the introducing,
wherein the second dielectric layer includes at least one of one of germanium nitride and silicon germanium nitride.

13. The method of claim 1 wherein the second dielectric layer includes a high K dielectric.

14. The method of claim 1 wherein the high K dielectric includes at least one of a metal oxide, a metal silicate, a metal oxynitride, and a metal silicon oxynitride.

15. The method of claim 14 wherein:
the metal oxide includes at least one of hafnium oxide, aluminum oxide, lanthanum oxide, titanium oxide, and tantalum oxide;
the metal silicate includes at least one of hafnium silicate, aluminum silicate, lanthanum silicate, titanium silicate, and tantalum silicate;
the metal oxynitride includes at least one of hafnium oxynitride, aluminum oxynitride, lanthanum oxynitride, titanium oxynitride, and LanLalum oxynitride; and
the metal silicon oxynitride includes at least one of hafnium silicon oxynitride, aluminum silicon oxynitride, lanthanum silicon oxynitride, titanium silicon oxynitride, and tantalum silicon oxynitride.

16. The method of claim 1 wherein after the introducing, the concentration proximate the first surface is on the order of approximately $4 \times 10^{21}$ per cm$^3$ and wherein the concentration proximate the second surface is on the order of approximately $2 \times 10^{20}$ per cm$^3$.

17. The method of claim 1 wherein the introducing forms a barrier layer including the diffusion barrier material in an upper portion of the first dielectric layer.

18. The method of claim 1 further comprising:
forming a layer of gate material over the second dielectric layer;
patterning the layer of gate material to form a gate from the layer of gate material, the gate located over the second dielectric layer.

* * * * *

UNITED STATES PATENT AND TRADEMARK OFFICE
CERTIFICATE OF CORRECTION

PATENT NO. : 7,144,825 B2 Page 1 of 1
APPLICATION NO. : 10/687271
DATED : October 16, 2003
INVENTOR(S) : Olubunmi O. Adetutu et al.

It is certified that error appears in the above-identified patent and that said Letters Patent is hereby corrected as shown below:

In Column 8, Line 7, Claim No. 15:
    Change "LanLalum" to --tantalum--,

Signed and Sealed this

Twenty-first Day of August, 2007

JON W. DUDAS
*Director of the United States Patent and Trademark Office*

UNITED STATES PATENT AND TRADEMARK OFFICE
CERTIFICATE OF CORRECTION

PATENT NO.         : 7,144,825 B2                                    Page 1 of 1
APPLICATION NO.    : 10/687271
DATED              : December 5, 2006
INVENTOR(S)        : Olubunmi O. Adetutu et al.

It is certified that error appears in the above-identified patent and that said Letters Patent is hereby corrected as shown below:

In Column 8, Line 7, Claim No. 15:
    Change "LanLalum" to --tantalum--,

This certificate supersedes Certificate of Correction issued August 21, 2007.

Signed and Sealed this

Eighteenth Day of September, 2007

JON W. DUDAS
*Director of the United States Patent and Trademark Office*